(12) United States Patent
Ikeda

(10) Patent No.: US 6,208,546 B1
(45) Date of Patent: Mar. 27, 2001

(54) MEMORY MODULE

(75) Inventor: Kouichi Ikeda, Niigata (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 09/284,614

(22) PCT Filed: Nov. 7, 1997

(86) PCT No.: PCT/JP97/04064

§ 371 Date: Jun. 24, 1999

§ 102(e) Date: Jun. 24, 1999

(87) PCT Pub. No.: WO98/21752

PCT Pub. Date: May 22, 1998

(30) Foreign Application Priority Data

| Nov. 12, 1996 | (JP) | ................................................ 8-315526 |
| Apr. 28, 1997 | (JP) | ................................................ 9-124868 |
| Jul. 9, 1997 | (JP) | ................................................ 9-199376 |

(51) Int. Cl.[7] ............................................ G11C 5/02
(52) U.S. Cl. ........................... 365/51; 365/63; 257/390; 257/693; 257/684; 257/734; 257/777; 257/782; 257/780; 257/786; 257/784
(58) Field of Search ................... 365/230.03; 257/691, 257/693, 390; 437/108

(56) References Cited

U.S. PATENT DOCUMENTS

| 5,309,011 | * | 5/1994 | Tazunoki et al. | ..................... 257/390 |
| 5,691,570 | * | 11/1997 | Kozuka et al. | ....................... 257/693 |
| 5,817,530 | * | 10/1998 | Ball | ....................................... 437/108 |

* cited by examiner

Primary Examiner—Viet Q. Nguyen
(74) Attorney, Agent, or Firm—Dellett and Walters

(57) ABSTRACT

An object of the present invention is to provide a memory module capable of being mounted easily on various memory boards or mother boards, having a large memory capacity, and requiring a small mounting area. The memory module 10 includes four memory bare chips 1 scribed from a semiconductor wafer and mounted on a module board 2 by the COB technology. The module board 2 is formed with a row of pads 4 near the center portion in the longitudinal direction of the module board 2. Two memory bare chips 1 are disposed on the module board 2 at opposite sides of the pads 4. Each memory bare chip 1 is formed with pads 3 along the center line and the pads 3 are connected to the pads 4 on the module board 2 by the use of bonding wires 5. The bonding wires 5 and the memory bare chips 1 are covered with a plastic resin 6. Also, the module board 2 is formed with external connection terminals 8 on the outer side edges for connection to a memory board or a mother board by the LCC technology.

10 Claims, 11 Drawing Sheets

FIG. 3
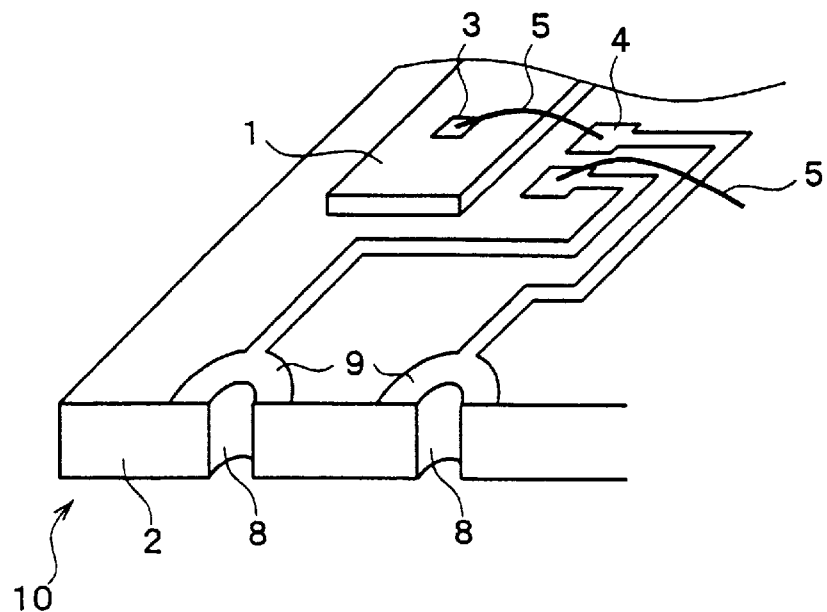
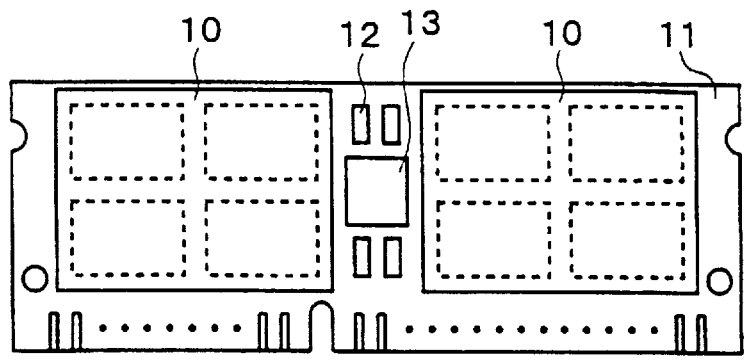
FIG.4(a)
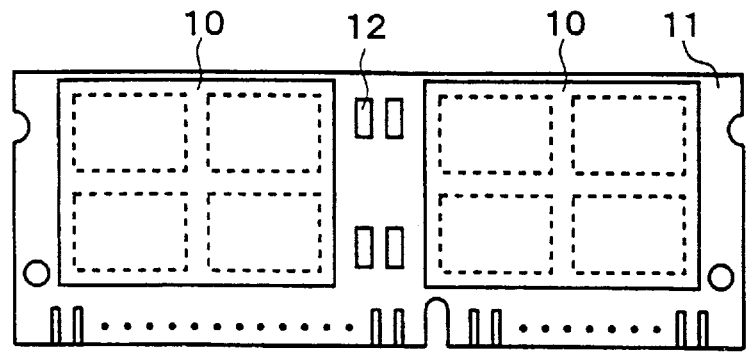
FIG.4(b)

FIG. 17
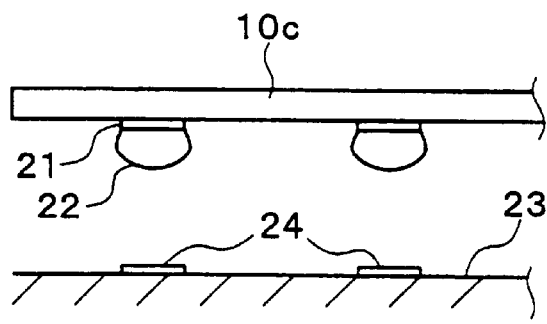
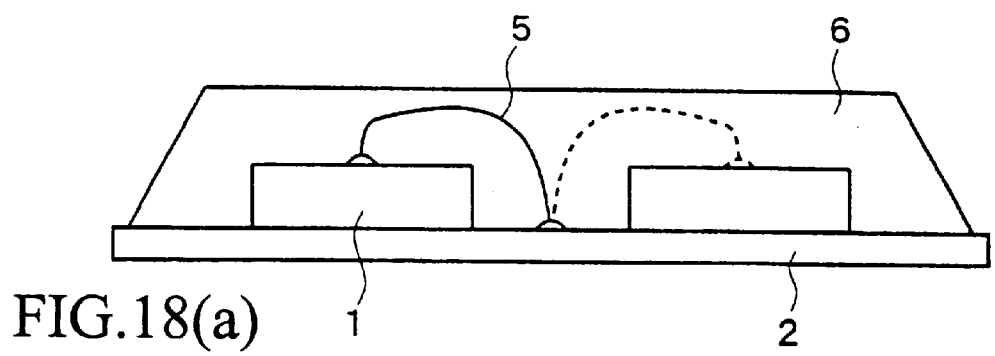
FIG.18(a)
FIG.18(b)
FIG. 19
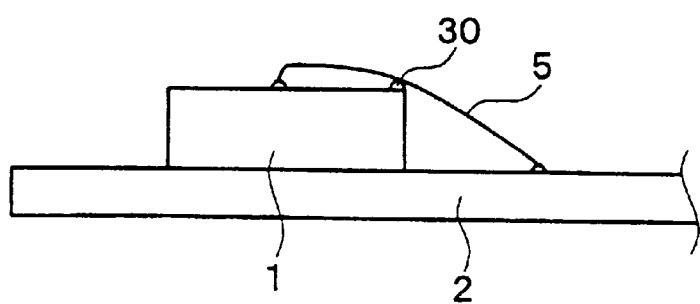

FIG. 20
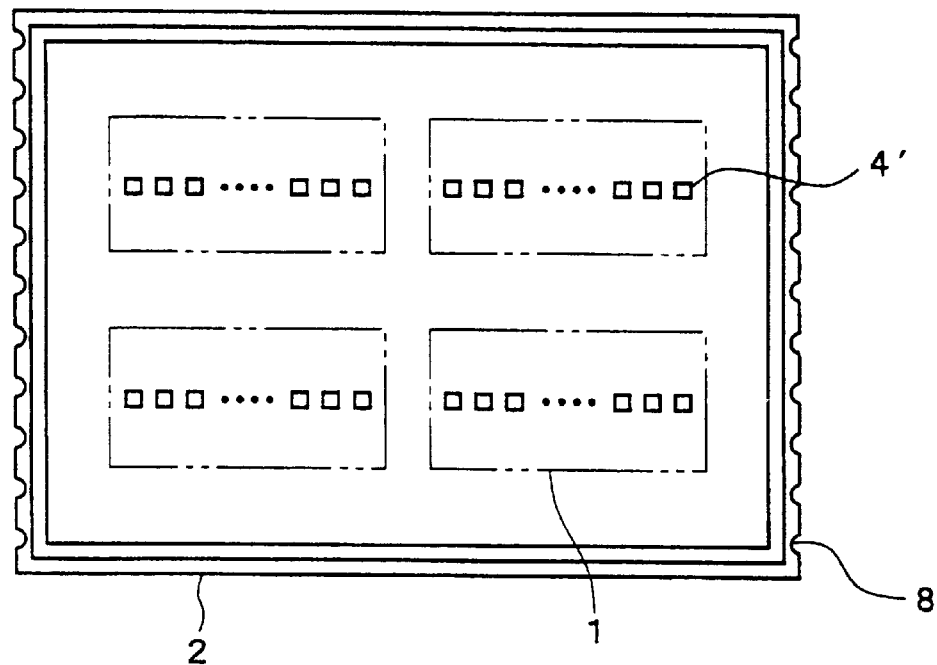
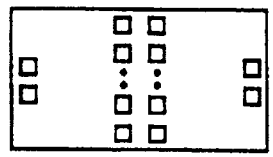
FIG.21(a)
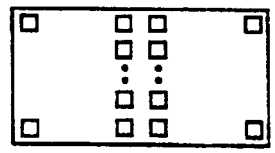
FIG.21(b)
FIG. 22
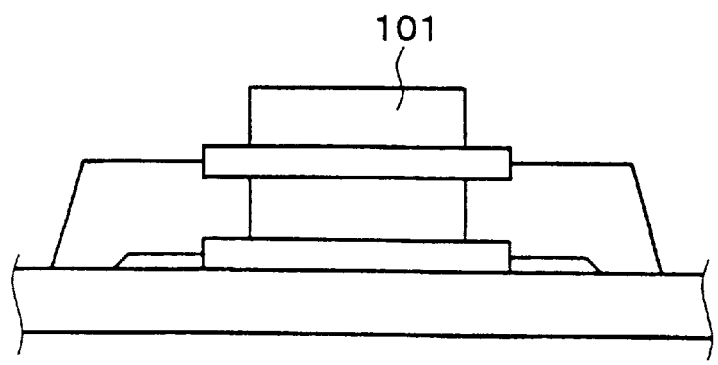

MEMORY MODULE

BACKGROUND OF THE INVENTION

1. Field of the Invention

The present invention relates to a memory module comprising a plurality of memory chips and capable of being mounted on a various memory board, mother board, etc.

2. Description of the Related Art

Computer programs are increasing larger. In order to process such programs at a high speed, there requires to install a large memory capacity inside a computer. There is provided inside a computer a memory board such as a SIMM (Single In-line Memory Module), DIMM (Dual In-line Memory Module), etc. There are mounted a large number of memory ICs on a memory board. Commonly used memory ICs are memory chips (bare memory chips) scribed from a semiconductor wafer and packaged.

Unfortunately, packaging a memory chip reduces the number of chips mountable on a memory board because memory chips are much larger in dimension than bare chips. As a result, it was necessary to mount memory ICs on both sides of a memory board or to stack a plurality of memory ICs as shown in FIG. 22 in order to increase the number of memory chips to be mounted. However, mounting memory ICs on both sides of a memory board is unable to further increase the memory capacity because a packaged memory IC is far larger than the size of a memory chip included therein. Also, stacking memory ICs 101 as shown in FIG. 22 is complex in construction and thus not easy to mount memory ICs. In other words, such memory boards including a plurality of stacked memory ICs are not easy to make in large quantity.

SUMMARY OF THE INVENTION

In order to overcome the abovementioned problems, an object of the present invention is to provide a memory module that is easily mountable on a memory board or mother board and is easy to increase the memory capacity.

A memory module of the present invention comprises a plurality of memory chips scribed from a semiconductor wafer and mounted on a module board and the module board is provided with external connection terminals that are accessible to each memory chip from outside the memory module. Mounting the bare memory chips on the module board helps to reduce the outer dimension of the module board. Also, unlike the case of mounting each memory chip on a memory board, the memory module carrying a plurality of memory chips is easier to mount on a memory board or the like because memory module can be mounted as a unit. Additionally, each memory module can easily be high density and large memory capacity because a plurality of memory modules are contained as a set.

Preferably, mounting 4 memory chips in 2 rows and 2 columns with the longer sides of adjacent rectangular memory chips opposed to each other on the abovementioned module board provides a module board having 4 times of the memory capacity of a memory chip, thereby substantially reducing the outer dimension of the module board. Regularly disposing memory chips on a module board in the above manner significantly reduces wasted mounting space and increases mounting density.

Also, the memory module according to the present invention features the module board formed with a plurality of pads in at least one row. The memory chips are mounted on both sides of the row of pads, concentrating the pads between the memory chips. This particular construction reduces the space for the pads as compared with disposing such pads separately at both sides of each memory chip. It is preferable that a row of pads are formed along the longer side of a memory chip and memory chips are disposed on both sides of the row of pads with connection pads of the memory chips in parallel with the row of the pads on the module board, thereby making the distance between the pads on the module board and the memory chips substantially constant which are effective for connection using bonding wires.

Preferably the memory module of the present invention features the module board formed with a plurality of pads in two rows so that memory chips are disposed at both sides of the rows of pads. Each memory chip is connected by bonding wires to the more distant row of pads rather than the closer row of pads, thereby providing a space necessary to connect the pads on the module board and the memory chip even if the memory chip is disposed adjacent to the pads due to high density mounting. As a result, wire bonding can be carried out easily.

In case of connecting by the abovementioned wire bonding, it is preferable to lead bonding wires alternately from both sides of the row of pads for ease of wire bonding operation in high density.

Alternatively, interconnection between the memory chips and the module board may be established by jointing the pads on the module board and the memory chips by using electrically conductive material such as solder balls or gold balls instead of bonding wires. Such flip chip technology is particularly suitable for high density mounting because the mounting area is substantially the same as the chip size.

It is also preferable that the memory module of the present invention uses 2 or more memory chips scribed from a semiconductor wafer as a unit to be mounted on a module board, thereby requiring less mounting area than mounting separately scribed memory chips and simplifying the alignment of the memory chip on the module board. Also, reducing the component count simplifies the assembling operation. In particular, there are two possibilities of scribing 2 or more memory chips along the longer side or along the shorter side. Also, there are 2 ways of interconnecting the intercoupled or continuous memory chips with the module board by utilizing the abovementioned bonding wires or by the flip chip technique. In any event, it is appreciated that the assembling operation including alignment of the memory chips on the module board can be simplified as compared to assembling a plurality of separate memory chips.

The memory module of the present invention preferably uses a module board formed with a plurality of recesses in the direction of thickness and the recesses and their peripheral areas are formed with electrically conductive material to define a memory chip mounting surface. The recesses may be utilized as external connection terminals, thereby eliminating the need for forming separate lead wires and enabling to mount in the size of the memory module.

Other than utilizing the recesses on the side surface of the abovementioned memory module board as external connection terminals, it is possible to form external connection terminals on the surface of the module board opposite to the memory chip mounting surface. Forming the external connection terminals on the surface of the module board is effective to mount the memory module of the present invention on a separate board in order to mount in the size of the memory module.

By choosing address terminals which are a part of the external connection terminals of the abovementioned module board to the same number as the address terminals of the memory chip, the total number of the external connection terminals can be reduced. In other words, by assigning common addresses to be used to access to each of the memory chips in the memory module, common address terminals can be used for the memory chips, thereby reducing the number of required terminals. Similarly, various control terminals which are a part of the external connection terminals on the module board can be shared with the memory chips, thereby reducing the total number of external connection terminals.

BRIEF DESCRIPTION OF THE DRAWINGS

The present invention will be described in detail with reference to the accompanying drawings, in which:

FIG. 3 is a perspective view of a part of the memory module as shown in FIG. 1;

FIGS. 4(a) and (b) are a schematic of an SO-DIMM board carrying the memory modules in FIG. 1, wherein (a) shows one surface while (b) shows the other surface;

FIG. 17 is a simplified drawing to illustrate BGA connection technique;

FIGS. 18(a) and (b) show various plastic packagings to cover memory bare chips of a memory module, wherein (a) is a transfer mold plastic packaging while (b) is a plastic packaging using a molding die;

FIG. 19 illustrates an example having an insulative projection at the edge of a memory bare chip;

FIG. 20 is a module board for flip chip mounting of memory bare chips;

FIGS. 21(a) and (b) show modified examples of forming pads on a bare memory chip in parallel with the short sides, wherein (a) and (b) are pad forming surfaces of a memory bare chip suitable for flip chip mounting; and FIG. 22 is an example of stacking a plurality of memory ICs.

DETAILED DESCRIPTION

Figure 1:
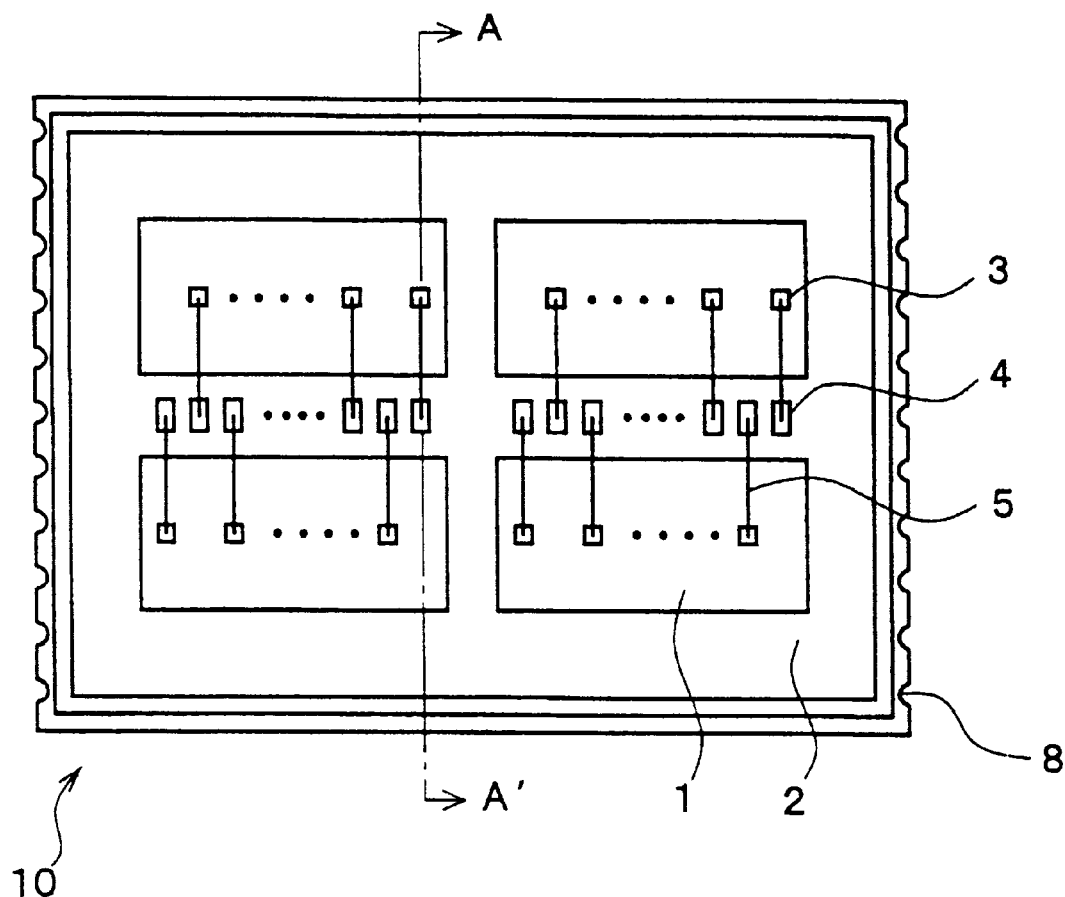
FIG. 1 is a plan view of one embodiment of the memory module according to the present invention.
Figure 2:
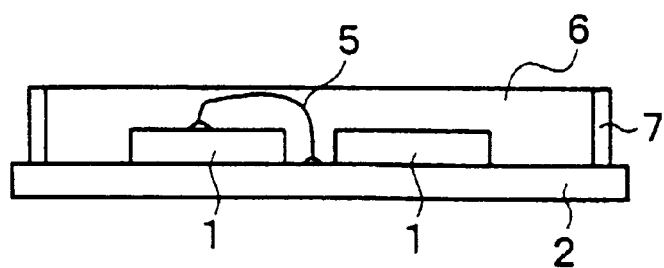
FIG. 2 is a cross section view of FIG. 1 along the line A-A–.

FIG. 1 is a plan view of one embodiment of a memory module according to the present invention and FIG. 2 is a cross section view of FIG. 1 along the line A-A' in FIG. 1. As apparent from these figures, a memory module 10 comprises 4 memory bare chips 1 scribed from a semiconductor wafer and mounted on a module board 2 by wire bonding technique which is commonly referred to as a COB (Chip On Board). Each memory bare chip 1 is a DRAM (Dynamic Random Access Memory) of for example 4M×4 bits or 16M bits. Each memory bare chip 1 is rectangular and has a plurality of pads 3 along a center line in parallel with the long sides.

The module board 2 has a dimension to be mounted on an SO-DIMM (Small Outline Dual In-line Memory Module) and formed with a plurality of pads 4 at substantially center portion along a line in parallel with the longitudinal direction. Two memory bare chips are disposed at each sides of the pads 4 with the line of the pads 3 on each module board 2 substantially in parallel with the row of pads 3 on each memory bare chip 1. In other words, the plurality of pads 4 are formed on the module board 2 between the two adjacent long sides of the memory bare chips 1 with the lines of the pads 4 and 3 being parallel with one another. The above-mentioned pads 3 and 4 correspond to pads for chips and board, respectively.

The pads 4 on the module board 2 and the pads 3 of the memory bare chips 1 are interconnected by bonding wires 5. As best shown in FIG. 1, the bonding wires 5 are alternately led out of the memory bare chips 1 disposed at both sides of the pads 4 so that the bonding wires 5 are substantially uniform in shape and length.

Since the pads 4 on the module board 2 are concentrated between the two memory bare chips 1 disposed adjacent to their long sides, the area occupied by the pads 4 can be reduced as compared with the case forming separate pads 4 at the peripheries of the respective memory bare chips 1, thereby making the memory module 10 compact and high density.

In a case of disposing two memory bare chips 1 in the same orientation with respect to the pads 4 on the module board 2, two pads 4 on the module board 2 for the same kind of pads 3 of the two adjacent memory bare chips 1 can be formed at adjacent positions. As a result, two memory bare chips 1 can be interconnected by simply adding wiring patterns on the surface of the module board 2, thereby eliminating the need for using a different wiring layer in the module board 2 for interconnection purpose and thus simplifying the wiring of the modular board 2.

If the bonding wires 5 are disposed too low for interconnection, a part of the bonding wires 5 may touch the edge of the memory bare chips 1 which may cause a trouble such as short-circuit or disconnection due to heat. On the other hand, if the bonding wires 5 are separated too far from the memory bare chips 1, the memory module 10 will be unnecessarily higher or thicker. It is therefore preferable that the bonding wires 5 are as low as possible but not in touch with the memory bare chips 1.

As best shown in FIG. 2, the wire bonded upper surface of the memory bare chips 1 in this particular embodiment of the memory module 10 is covered with plastic resin 6 to prevent damages of the wiring. For this purpose, there is provided a sealing frame 7 of a predetermined height at the periphery of the module board 2 so that the plastic resin 6 is flown inside the sealing frame 7 and the plastic resin 6 will be flush with the sealing frame 7, thereby avoiding the memory module to be too high. In this manner, any variation in height of the memory module 10 is restricted.

This embodiment of the memory module 10 can be mounted on various types of board such as SO-DIMM by so called LCC (Leadless Chip Carrier) technique. Shown in FIG. 3 is a perspective view of a part of the memory module 10 as shown in FIG. 1. As apparent from FIG. 3, the module board 2 is formed with recessed external connection terminals 8 on the outer side surface. These external connection terminals 8 are electrically connected to the pads 4 on the surface of the module board 2 by way of wiring patterns 9 formed on the surface or inside of the module board 2. By allowing solder to flow inside the recesses of the external connection terminals 8, electrical as well as mechanical connection with an SO-DIMM or the like can be established simultaneously.

Since the embodiment of the memory module 10 can establish electrical connection with other board by allowing solder to flow on the outer surface of the external connection terminals 8, the mounting area corresponds to the size of the module. Additionally, four unpackaged memory bare chips 1 are mounted on each module board 2. As a result, seeing from the other board on which the memory module 10 is mounted, the mounting is a CSM (Chip Size Module), one step ahead of a CSP (Chip Size Package) which is one of the most advanced memory mounting techniques.

Also, since the embodiment of the memory module 10 mounts on a small module board 2 the memory bare chips 1 scribed from a semiconductor wafer without packaging, a plurality (for example 4) of memory bare chips 1 can be mounted without any difficulty.

Additionally, since the number of the external connection terminals 8 is not much different from terminals of conventional memory ICs, the number of wirings can be reduced significantly as compared to the case of separately mounting conventional memory ICs on an SO-DIMM or the like, thereby significantly decreasing the number of assembling steps and also production cost. Now considering the case of mounting on the module board 2, for example, four 4M×4 bits memory bare chips 1 to obtain the memory module 10 of 4M×16 bits configuration, address terminals can be commonly used by the four memory bare chips 1 and many control terminals such as write enable terminal, chip enable terminal can also be used commonly. For example, write enable terminal, output enable terminal and RAS terminal excluding CAS terminal can be used commonly by the all memory bare chips 1. The total number of the external connection terminals 8 of the memory module 10 is not much different from the total number of the pads 3 of each memory bare chip 1.

Now, reference is made to FIG. 4 showing a plan view of an SO-DIMM 11 having the memory modules 10 mounted thereon. FIG. 4(a) shows one side of the SO-DIMM 11 while FIG. 4(b) shows the other side. The SO-DIMM 11 as shown in FIG. 4 has two memory modules 10 on each side and also includes two noise protection capacitors 12 for each memory module 10. A controller 13 is mounted on one side for inspection of the memory bare chips 1. As mentioned above, each memory module 10 is mounted by the LCC technology while the capacitors 12 and the controller 13 are mounted by SMT (Surface Mount Technology).

Figure 5:
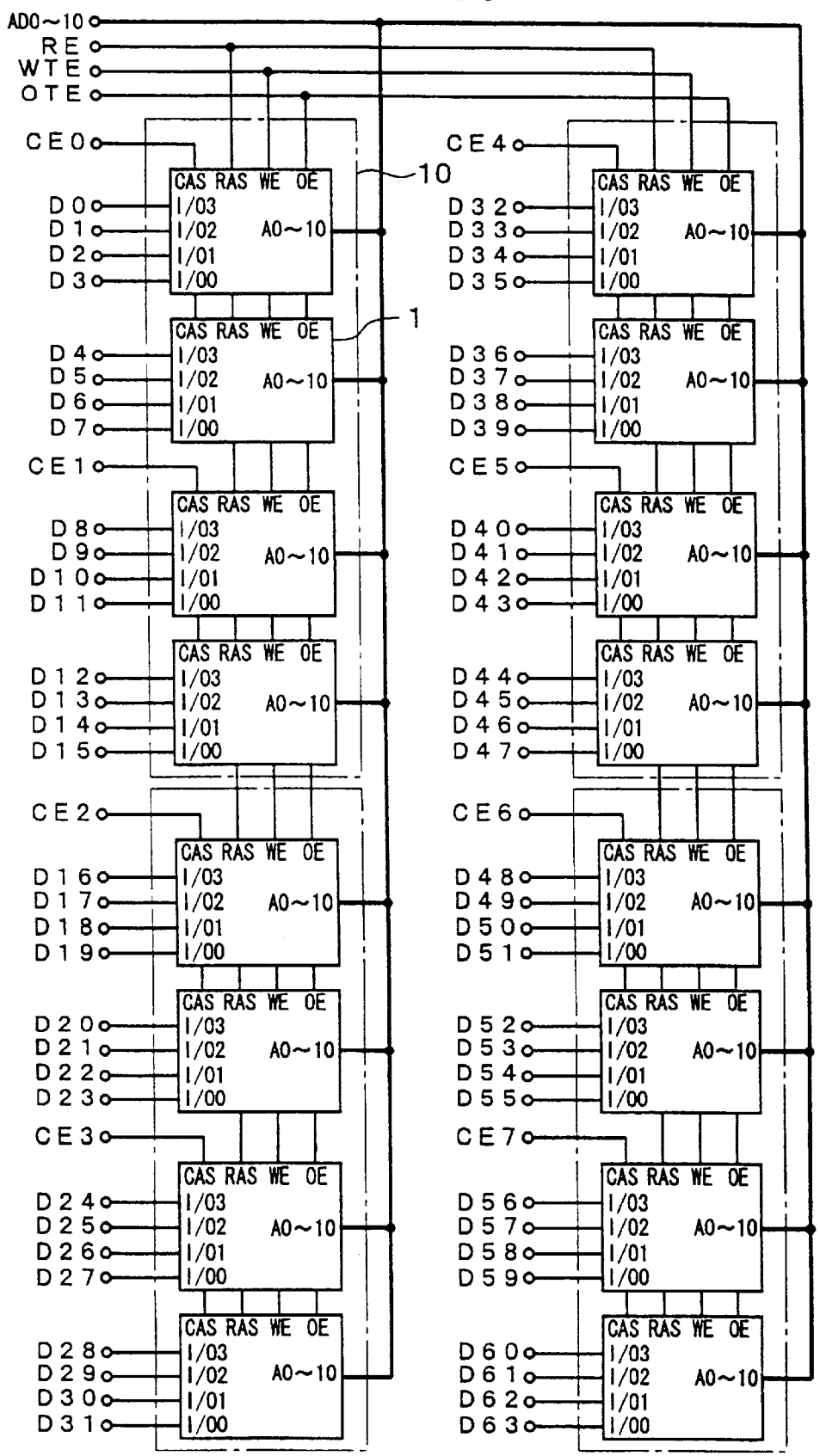
FIG. 5 is a circuit diagram of the SO-DIMM board shown in FIGS. 4(a) and (b)

FIG. 5 is an electrical circuit diagram of the SO-DIMM as shown in FIG. 4 but excluding the capacitors 12 and the controller 13 for simplicity. Enclosed in phantom lines in FIG. 5 are the memory modules 10. Note that write enable WE, output enable OE and RAS terminals excluding CAS terminal among the various control terminals as well as the address terminals A0–10 are commonly connected to all memory bare chips 1. Therefore, these terminals can be simply interconnected among the memory bare chips 1 and then connected to the respective external connection terminals 8, thereby minimizing the number of external connection terminals 8 of each memory module 10.

The SO-DIMM board 11 as shown in FIGS. 4(a) and (b) and FIG. 5 equivalent to mounting eight memory ICs per side or 16 memory ICs per both sides. If each memory bare chip 1 contained in each memory module 10 is, for example, 4M×4 bits configuration, memory capacity of each memory module 10 is 8M bytes. The total memory capacity of the SO-DIMM 11 is therefor 32M bytes.

It is to be noted that the present invention should not be limited to the particular embodiment as described hereinabove and that various modifications can be made without departing from the scope of the present invention. For example, although each memory bare chip is scribed from a semiconductor wafer in the above embodiment, a unit of two or more memory bare chips may be scribed from a semiconductor wafer. A mounting area can be further reduced by mounting on the module board 2 the memory module 10 carrying a unit of a plurality of memory bare chips 1 having two or more rows of pads 3, thereby reducing the outer dimension of the memory module 10. Scribing a plurality of memory bare chips 1 as a set is effective in simplifying alignment on the module board 2 and also simplifying the scribing of the semiconductor wafer.

Figure 6A:
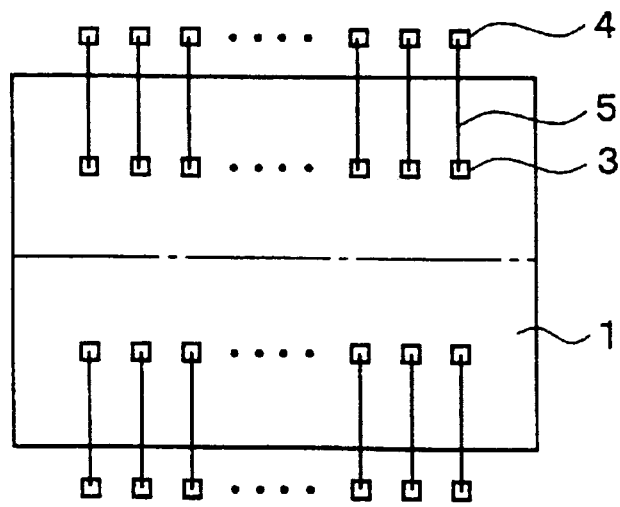
FIGS. 6(a) and (b) show how 2 or more memory bare chips are scribed from a semiconductor wafer as a unit, wherein (a) shows 2 memory bare chips scribed with the long sides intercoupled while (b) shows 2 memory bare chips scribed with the short sides intercoupled.
Figure 6B:
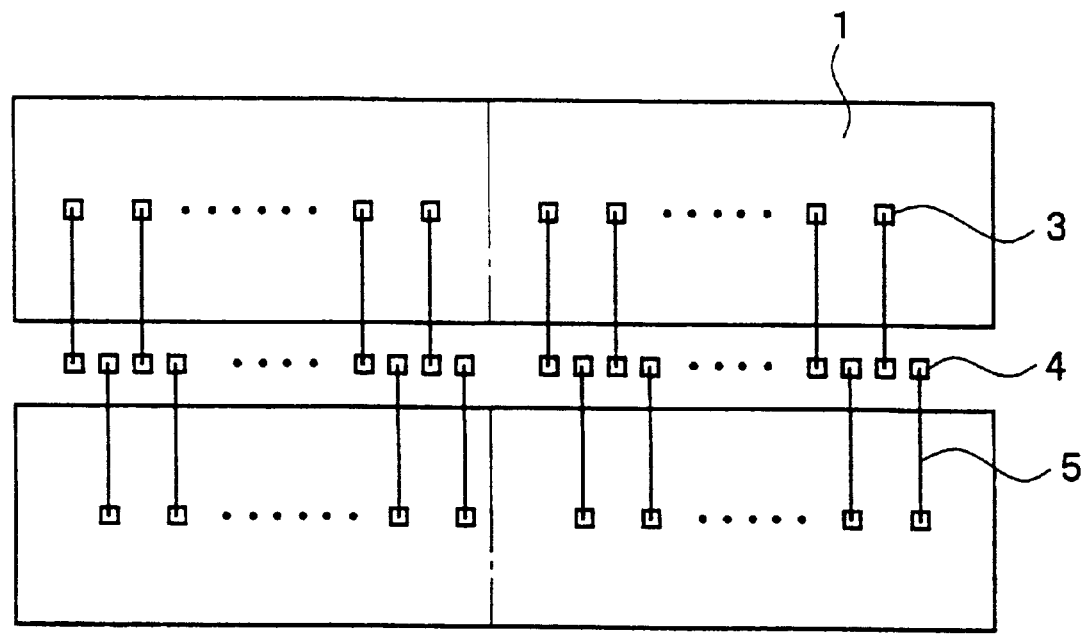

FIGS. 6(a) and (b) illustrate examples of scribing a set of two or more memory bare chips 1 from a semiconductor wafer. FIG. 6(a) is an example of scribing two rectangular memory bare chips 1 with the long sides intercoupled while FIG. 6(b) is an example of scribing two memory bare chips 1 with the short sides intercoupled. In case of scribing as shown in FIG. 6(b), the pads 4 may be formed near the center portion of the module board 2 as shown in FIG. 1. However, in case of scribing as shown FIG. 6(a), the pads 4 must be formed along outer sides of the module board 2.

Although described in FIG. 1 is to mount the memory bare chips 1 each having a plurality of pads 3 in a line, the memory module 10 can be constructed by the use of memory bare chips 1 each having a plurality of pads in plural lines.

Figure 7:
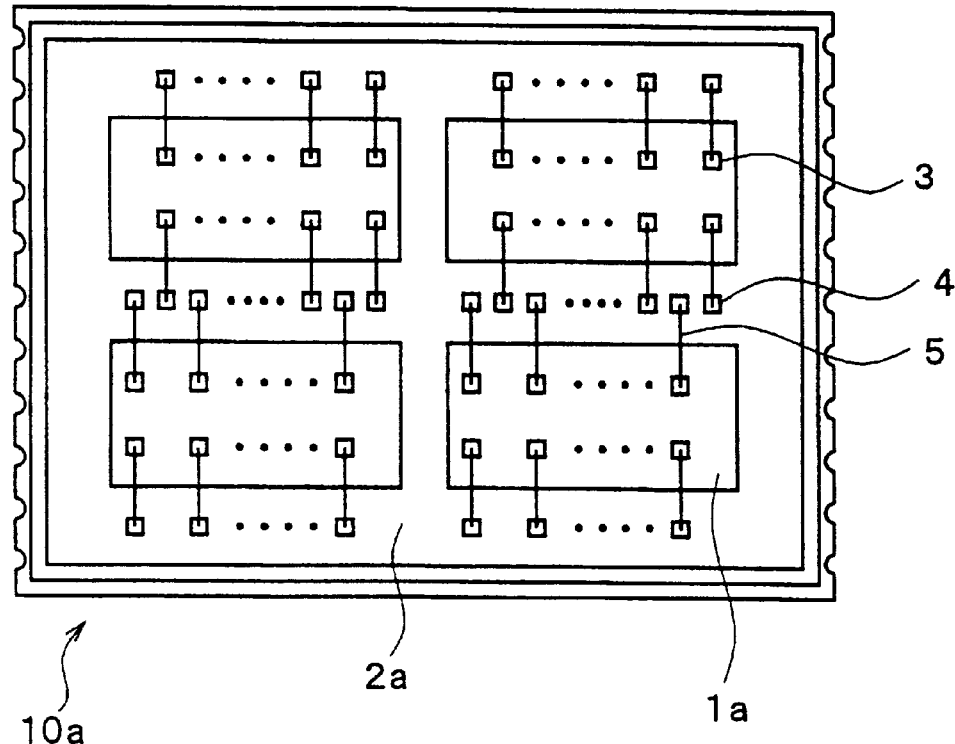
FIG. 7 is a plan view of a memory module comprising memory bare chips having 2 rows of pads in parallel with the long sides.

FIG. 7 is a plan view of a memory module 10a comprising memory bare chips 1a each having two lines of pads 3 near the center portions. In case of FIG. 7, it is preferable to form the pads along outer sides of the module board 2a. Connection of the pads 4 near the center portion of the module board 2a may be made by alternately disposing bonding wires 5 from both sides of the memory bare chips in the similar manner to FIG. 1. It is also possible to form two rows of pads 3 near the outer edges of each memory bare chip as shown in FIG. 8 unlike forming two rows of pads 3 near the center portions of each memory bare chip 1a.

Figure 8:
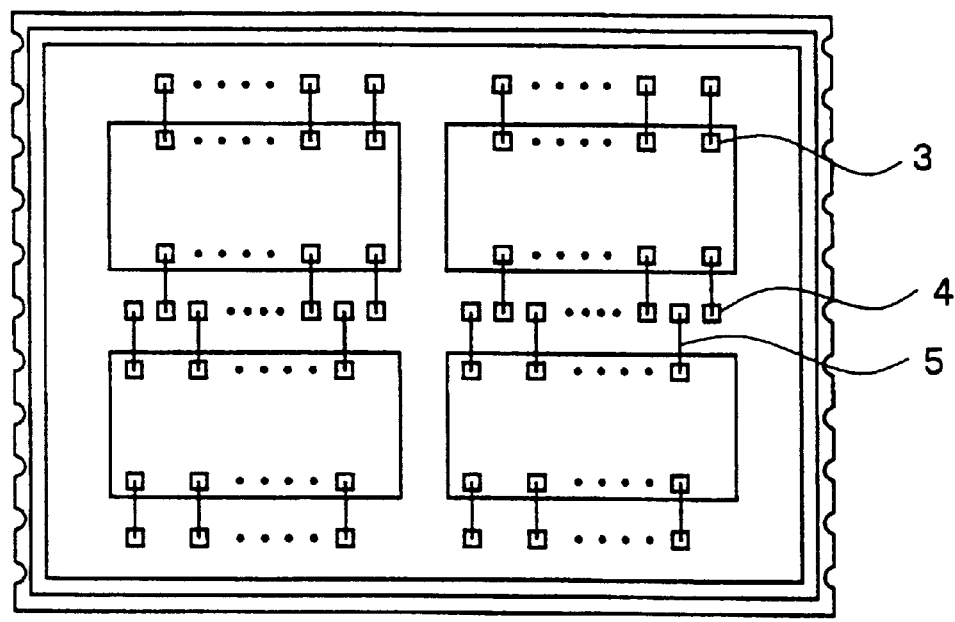
FIG. 8 is a plan view of a memory module comprising other memory bare chips having 2 rows of pads in parallel with the long sides.
Figure 9:
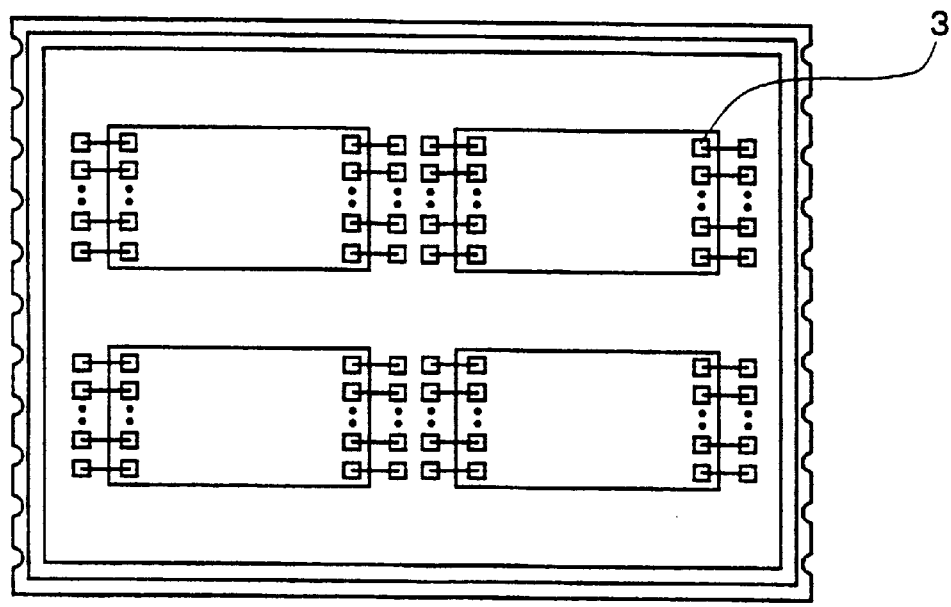
FIG. 9 is a plan view of memory bare chips having 2 rows of pads in parallel with the short sides.
Figure 10:
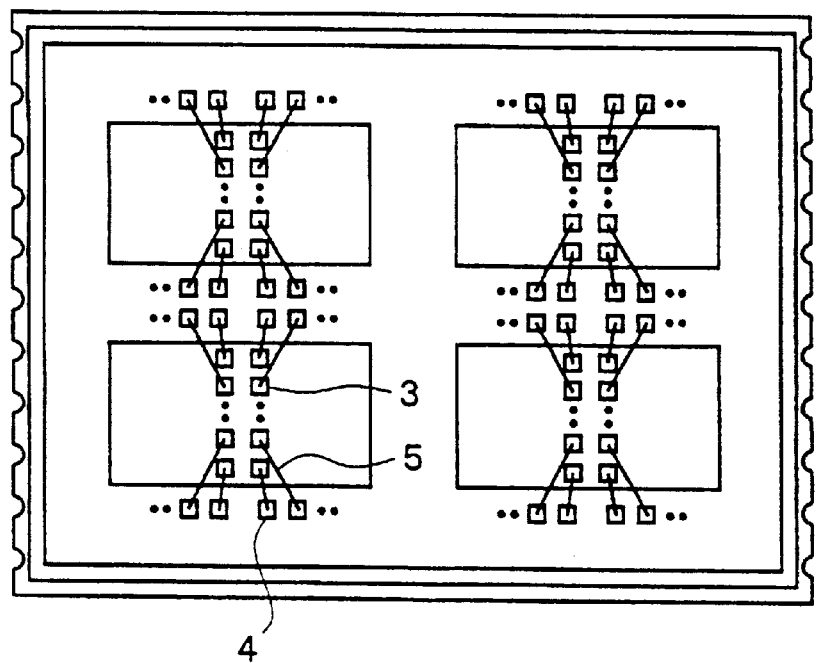
FIG. 10 is a plan view of a memory module comprising other memory bare chips having 2 rows of pads in parallel with the short sides.
Figure 11:
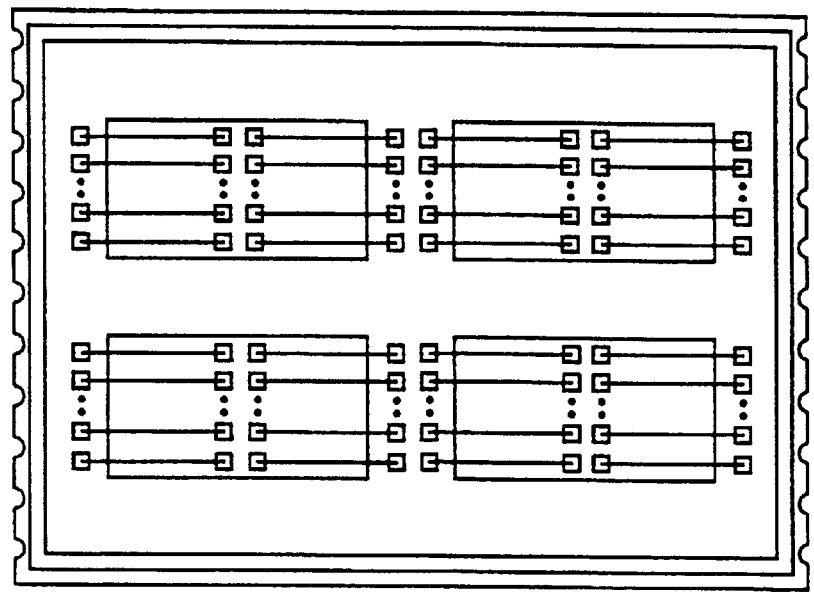
FIG. 11 is a plan view of a memory module comprising other memory bare chips having 2 rows of pads in parallel with the short sides.

Although two rows of pads 3 are formed along the long sides of the rectangular memory bare chips in FIGS. 7 and 8, two rows of pads 3 may be formed along the short sides as illustrated in FIG. 9. It is also possible to form two rows of pads 3 near center portions in parallel with the short sides of each memory bare chip as shown in FIG. 10. In this case, it is preferable to lead the bonding wires 5 directly towards the pads 3 rather than in perpendicular to the rows of the pads 3 as shown in FIG. 10. Alternatively, the bonding wires 5 may be led out in perpendicular to the rows of the pads depending on the length of the long sides of the memory bare chips as shown in FIG. 11.

Figure 12:
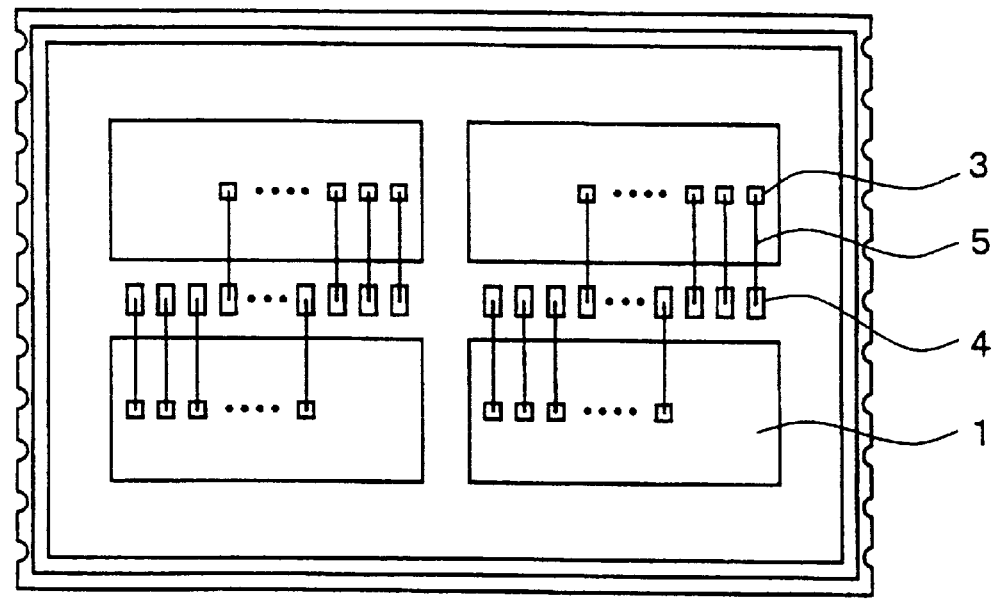
FIG. 12 shows how a plurality of bonding wires are led out alternately.

Although the bonding wires 5 are alternately led out of the memory bare chips 1 mounted on both sides of the pads 4 on the module board 2 in FIG. 1, the bonding wires 5 may be led out alternately in a group of plural wires as shown in FIG. 12. Such wire bonding simplifies repair works of any defective memory bare chip 1.

Figure 13:
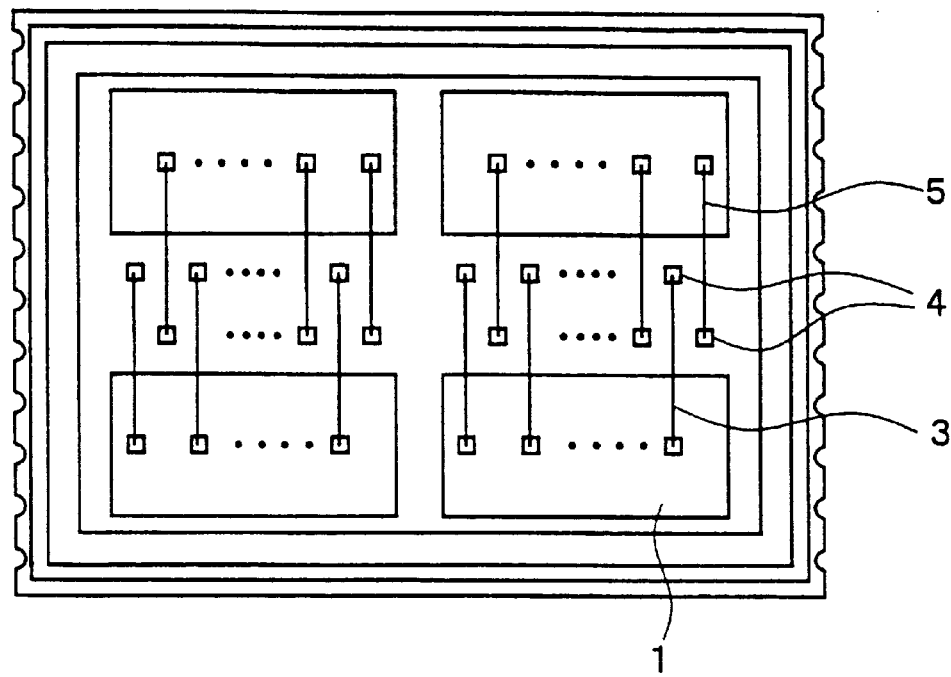
FIG. 13 shows an example of a module board formed with 2 rows of pads.

In the embodiment of FIG. 1, the pads 4 are formed on the module board 2 in a single line. However, it is possible to form the pads 4 in more than two lines. Shown in FIG. 13 is an example of a module board 2 having two rows of pads 4 between memory bare chips 1 disposed at both sides of the rows of pads 4. In connecting each pad 3 of each memory bare chip 1, the bonding wire 5 extends beyond the closer row of pads and is connected to the respective pads 4 in the remote row of pads 4. Such wire bonding is effective to reduce the height of the bonding wires 5 and also simplifies the bonding operation. It is also effective to increase mounting density of the memory bare chips 1 by partly overlapping the bonding wires 5.

Figure 14:
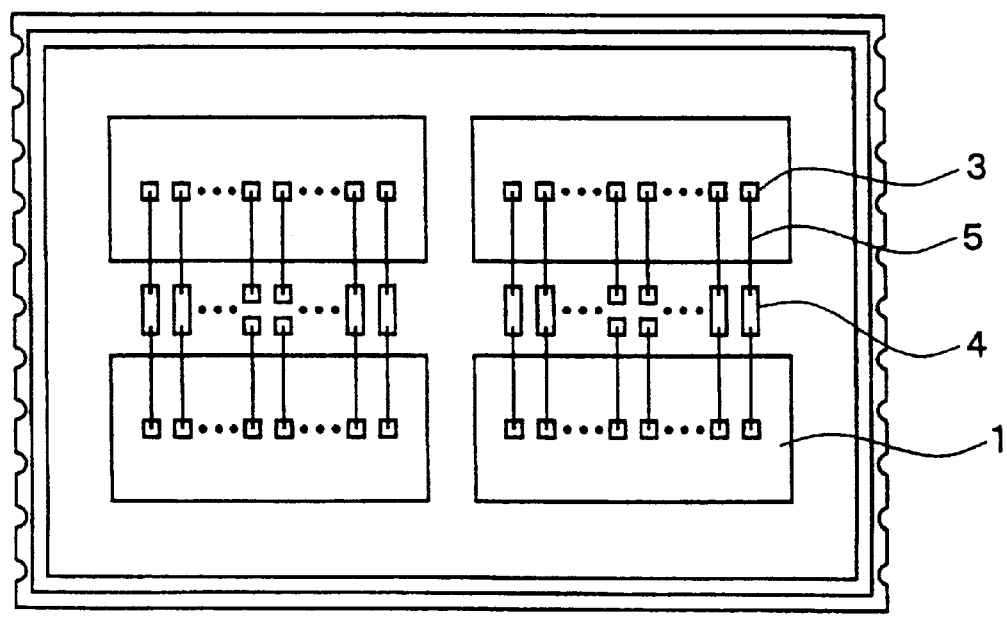
FIG. 14 is a plan view of a memory module using partly double rows of pads for connecting memory bare chips.

Shown in FIG. 14 is a memory module comprising the module board 2 formed with partly double rows of pads 4 and single row of pads 4 being used commonly by the memory bare chips at both sides of the pads. In this particular example, a plurality of pads 4 are formed in a single or dual rows in the area between the two memory bare chips 1 and the single row of pads 4 are commonly connected to the bonding wires 5 from the both memory bare chips 1. Commonly connected terminals such as the address terminals and various control terminals of each memory bare chip 1 are commoned to the pads 4 on the module board 2 by connecting two bonding wires 5, thereby decreasing the total number of pads 4 as compared to the total number of pads 3 of the entire memory bare chips 1. Connecting two bonding wires 5 to some of the pads 4 establishes common connection of two bonding wires 5 simultaneously by way of each common pad 4, thereby decreasing the total number of wirings on the module board 2. For example, the number of layers of the module board 2 can be decreased as compared to the case of using a multi-layer module board, thereby reducing cost of the memory module.

Although the memory module 10 in FIG. 1 contained four memory bare chips 1, the number of memory bare chips 1 should not be limited to four but can be any desired number. However, mounting too many memory bare chips 1 tends to increase defective rate of the memory module 10. It is therefore preferable that the number of the memory bare chips 1 is determined in consideration of the number of bits and necessary memory capacity of the memory module 10. The memory bare chips 1 to be mounted on the module board 2 should be even number because most computers usually manage memory capacity by multiples of 4.

Figure 15:
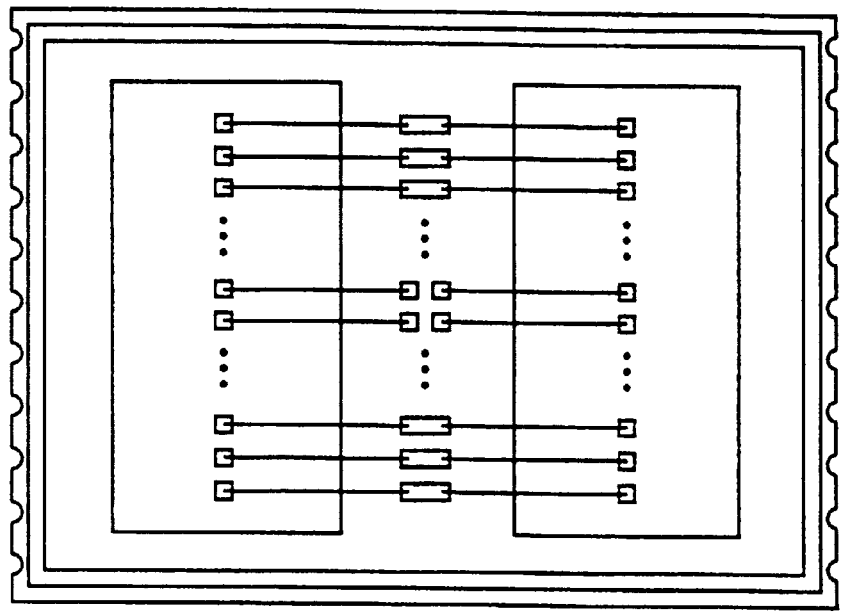
FIG. 15 is a plan view of a memory module comprising 2 memory bare chips.
Figure 16:
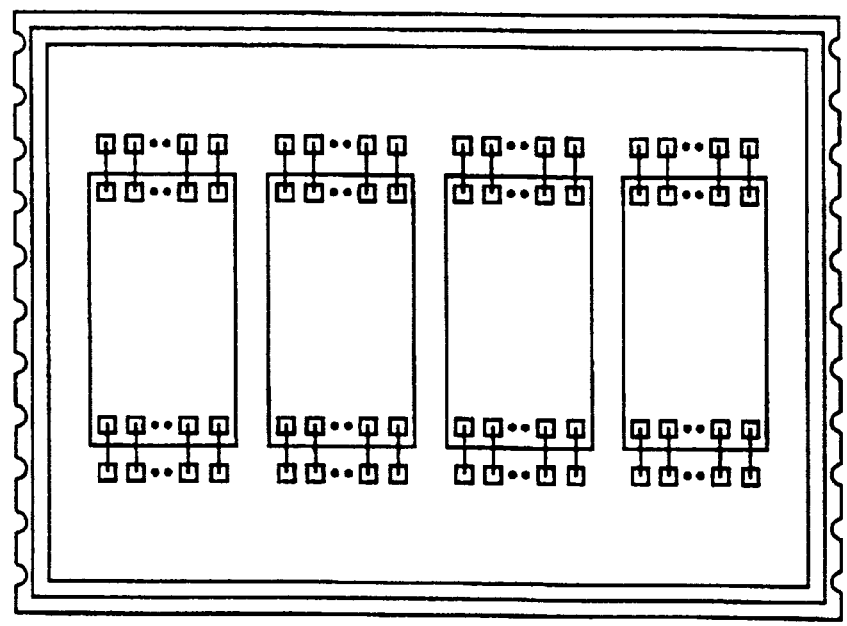
FIG. 16 is a plan view of a memory module comprising 4 memory bare chips disposed in the same direction.

FIG. 15 shows an example of memory module comprising two memory bare chips. In case of mounting memory bare chips having 64M bits memory capacity on the module board 2 in, for example, FIG. 1, it is impossible to mount four chips but it is possible to configure a memory module having two memory bare chips as shown in FIG. 15 if the entire capacity of the memory module may not be very large. Alternatively, it is possible to configure a memory module using four memory bare chips disposed in one direction as shown in FIG. 16.

Although the completed memory modules 10 are mounted on an SO-DIMM board or the like by the LCC technology in the abovementioned example, it is possible to mount by a BGA (Ball Grid Array) technology. Illustrated in FIG. 17 is a simplified figure showing the BGA technology. As apparent from FIG. 17, the BGA technology is to form a plurality of pads 21 for external connection on the chip mounting surface of a memory module 10c and then bumps 22 are attached to the pads 21. The memory module 10c is then turned up-side-down for jointing the pads 21 of the memory module 10c to pads 24 on an SO-DIMM 23 or the like by way of the bumps 22. Since the BGA technology makes connection by way of the bumps 22, it has a disadvantage that the height of the memory module 10c is higher than the LCC technology but is advantageous in eliminating the need for forming external connection terminals 8 on the outer side surfaces of the memory module 10c. Also, elimination of the bonding wires 5 is effective for high density mounting like the LCC technology.

In the abovementioned embodiment, it is described that DRAMs of various capacities (e.g., 16M bits or 64M bits) are mounted on the module board 2. It is also possible to mount many other types of memory bare chips such as synchronous DRAMs, SRAMs (Static Random Access Memories), flash ROMs (Read Only Memories), etc.

Although the example of allowing the plastic resin 6 to flow in the sealing frame 7 at the outer periphery of the module board 2 is described with reference to FIG. 2, filling the chip mounting surface of the module board 2 with the plastic resin 6 is not restricted to the example in FIG. 2. For example, the transfer mold may be formed by injection molding as shown in FIG. 18(*a*) or the plastic resin 6 may be simply applied on the chip mounted portions without using the sealing frame 7 or the molding die as shown in FIG. 18(*b*). The former method of FIG. 18(*a*) requires the molding die but is suitable for quantity production because molding time may be reduced while the latter method of FIG. 18(*b*) is difficult to maintain the height of the plastic resin 6 constant but is cost advantageous.

It is also preferable that the memory module 10 uses the memory bare chip 1 formed with an insulative projection 30 along the edge of the memory bare chip 1 over which the bonding wires 5 are led out as shown FIG. 19. The wire bonding is carried out after formation of the insulative projection 30, thereby maintaining good isolation between the bonding wires 5 and the memory bare chip 1.

Although there is described in the above embodiment to connect the memory bare chips to the module board by wire bonding or the COB technology, a conventional flip chip technology may be utilized. In this case, further high density mounting is possible and thus the outer dimension of the memory module 10 can be further reduced. Shown in FIG. 20 is a module board for mounting thereon memory bare chips 1 as shown in FIG. 1 by flip chip technology. As shown in FIG. 20, the module board is formed with the pads 4' on the surface thereof at the same pitch as the pads 3 on the memory bare chips 1 as shown in FIG. 1. The flip chip mounting can be achieved by disposing the pads 4' and the pads 3 on the memory bare chips 1 in alignment with one another.

The memory bare chips as shown in FIGS. 7, 8 and 9 are particularly suitable for flip chip mounting because they have two rows of pads 3 at remote locations. On the other hand, the memory chip as shown in FIG. 10 may encounter unstability in the flip chip mounting because the two rows of pads 3 are concentrated on the center portion. It is therefore preferable that a plurality of pads are formed near end portions closer to the short sides of the memory bare chips as shown in FIGS. 21(a) and (b).

The COB mounting technology may be replaced by the COG (Chip On Glass) technology for mounting chips on a glass substrate or the COF (Chip On Film) technology and the module board 2 may be made from any conventional material.

INDUSTRIAL APPLICABILITY

As described above, the memory module of the present invention features in mounting a plurality of unpackaged memory chips on the module board, thereby increasing mounting density of the memory chips and enabling to mount a plurality of memory chips in a small area. Also, the memory module can be connected on an SO-DIMM or the like with larger memory capacity as compared to mounting packaged memory chips.

What is claimed is:

1. A memory module comprising a plurality of memory chips scribed from a semiconductor wafer and mounted on a module board which is formed with a plurality of external connection terminals for carrying signals to and from the plurality of memory chips,
    wherein the module board is formed with at least one row of pads and the memory chips are disposed on the module board at opposite sides of the row of pads,
    wherein each of the memory chips is formed with at least one row of pads along the longer sides and the memory chips are mounted on the module board with the pads on the module board and the memory chips substantially parallel with one another, and
    wherein the pads on the module board and the pads on the memory chips are interconnected by bonding wires.

2. A memory module of claim 1, wherein the bonding wires are grouped with one or more wire and alternately connected to the pads on the module board from the memory chips disposed at opposite sides of the row of pads.

3. A memory module comprising a plurality of memory chips scribed from a semiconductor wafer and mounted on a module board which is formed with a plurality of external connection terminals for carrying signals to and from the plurality of memory chips,
    wherein the module board is formed with two rows of pads, equal number of the memory chips are disposed on the module board at opposite sides of the row of pads, and the pads in one row on the module board are connected to the pads on the memory chips more remote from the row of the pads by using bonding wires.

4. A memory module comprising a plurality of memory chips scribed from a semiconductor wafer and mounted on a module board which is formed with a plurality of external connection terminals for carrying signals to and from the plurality of memory chips,
    wherein the module board is formed with a plurality of pads formed in correspondence to the plurality of memory chips, the memory chips are formed with a plurality of pads in correspondence to the pads on the module board, and the corresponding pads on the module board and the pads of the memory chips are interconnected by way of electrically conductive material.

5. A memory module comprising a plurality of memory chips scribed from a semiconductor wafer and mounted on a module board which is formed with a plurality of external connection terminals for carrying signals to and from the plurality of memory chips,
    wherein the memory chips formed on the semiconductor wafer are scribed in a group of two or more before being mounted on the module board, and
    wherein the memory chips in a group of plural chips are scribed and mounted on the module board by the use of bonding wires.

6. A memory module comprising a plurality of memory chips scribed from a semiconductor wafer and mounted on a module board which is formed with a plurality of external connection terminals for carrying signals to and from the plurality of memory chips,
    wherein the memory chips formed on the semiconductor wafer are scribed in a group of two or more before being mounted on the module board, and
    wherein the module hoard is formed with a plurality of pads in correspondence to the memory chips scribed in the group, the memory chips are formed with a plurality of pads at locations corresponding to the pads on the module board, and the corresponding pads on the module board and the memory chips are interconnected by way of electrically conductive material.

7. A memory module comprising a plurality of memory chips scribed from a semiconductor wafer and mounted on a module board which is formed with a plurality of external connection terminals for carrying signals to and from the plurality of memory chips,
    wherein the module board is rectangular and formed with a plurality of recessed portions in the direction of thickness along opposed side edges to define external connection terminals by forming the surface of the recessed portions and the peripheries thereof with electrically conductive material.

8. A memory module comprising a plurality of memory chips scribed from a semiconductor wafer and mounted on a module board which is formed with a plurality of external connection terminals for carrying signals to and from the plurality of memory chips,
    wherein the module board is formed with the external connection terminals on the opposite surface to the memory chip mounting surface.

9. A memory module comprising a plurality of memory chips scribed from a semiconductor wafer and mounted on a module board which is formed with a plurality of external connection terminals for carrying signals to and from the plurality of memory chips,
    wherein the number of address terminals included in the plurality of external connection terminals formed in the module board is equalized to the number of address terminals of the memory chips.

10. A memory module comprising a plurality of memory chips scribed from a semiconductor wafer and mounted on a module board which is formed with a plurality of external connection terminals for carrying signals to and from the plurality of memory chips,
    wherein each of the memory chips has a plurality of control terminals including write enable, output enable, RAS and CAS terminals, and all of the control terminals except the CAS terminal are commonly connected to all of the memory chips.

* * * * *